(12) United States Patent
Thoma et al.

(10) Patent No.: US 6,487,134 B2
(45) Date of Patent: Nov. 26, 2002

(54) SINGLE-EVENT UPSET TOLERANT LATCH FOR SENSE AMPLIFIERS

(75) Inventors: Nandor G. Thoma, Manassas, VA (US); Scott E. Doyle, Centreville, VA (US)

(73) Assignee: BAE Systems Information and Electronic Systems Integration, Inc., Nashua, NH (US)

( * ) Notice: Subject to any disclaimer, the term of this patent is extended or adjusted under 35 U.S.C. 154(b) by 0 days.

(21) Appl. No.: 09/927,059

(22) Filed: Aug. 9, 2001

(65) Prior Publication Data

US 2002/0018372 A1 Feb. 14, 2002

Related U.S. Application Data

(60) Provisional application No. 60/224,648, filed on Aug. 11, 2000.

(51) Int. Cl.$^7$ ................................................ G11C 7/00
(52) U.S. Cl. ........................ 365/205; 365/207; 365/208; 365/189.05; 327/51; 327/57
(58) Field of Search ...................... 365/189.05, 189.08, 365/205, 207, 208; 327/51, 52, 55, 57, 208, 210, 214, 215

(56) References Cited

U.S. PATENT DOCUMENTS 4,555,777 A * 11/1985 Poteet .......................... 365/205
5,896,334 A * 4/1999 Casper et al. ................ 365/200
5,953,276 A * 9/1999 Baker ........................... 327/52
6,285,604 B1 * 9/2001 Chang .......................... 365/200

* cited by examiner

Primary Examiner—Richard Elms
Assistant Examiner—VanThu Nguyen
(74) Attorney, Agent, or Firm—Anthony P. Ng; Bracewell & Patterson, L.L.P.

(57) ABSTRACT

A single-event upset tolerant sense latch circuit for sense amplifiers is disclosed. The single-event upset tolerant sense latch circuit includes a first set of isolation transistors, a second set of isolation transistors, a first set of dual-path inverters, a second set of dual-path inverters, and an isolation transistor. The first set of isolation transistors is coupled to a first bitline, and the second set of isolation transistors is coupled to a second bitline. The second bitline is complementary to the first bitline. The first set of dual-path inverters is coupled to the first set of isolation transistors, and the first set of dual-path inverters includes a first transistor connected to a second transistor in series along with a third transistor connected to a fourth transistor in series. The second set of dual-path inverters is coupled to the second set of isolation transistors, and the second set of dual-path inverters includes a fifth transistor connected to a sixth transistor in series along with a seventh transistor connected to an eighth transistor in series. The isolation transistor couples the first and second sets of dual-path inverters to ground.

26 Claims, 5 Drawing Sheets

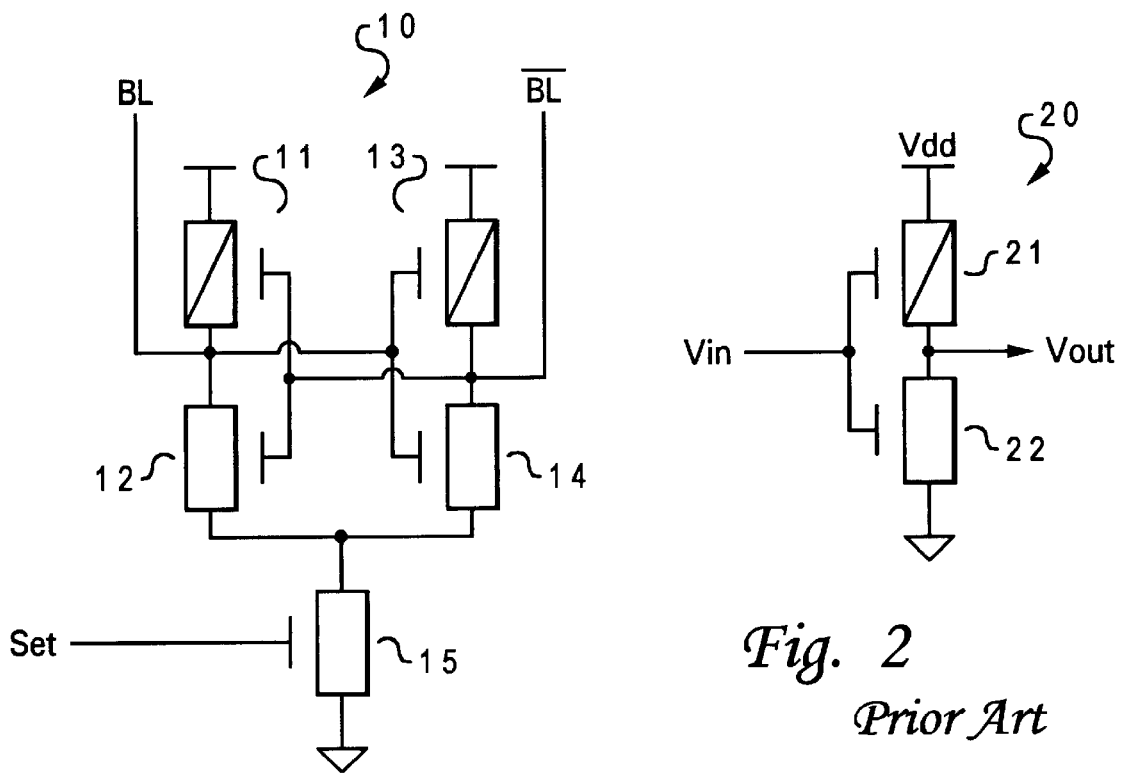
*Fig. 1*
*Prior Art*
*Fig. 2*
*Prior Art*
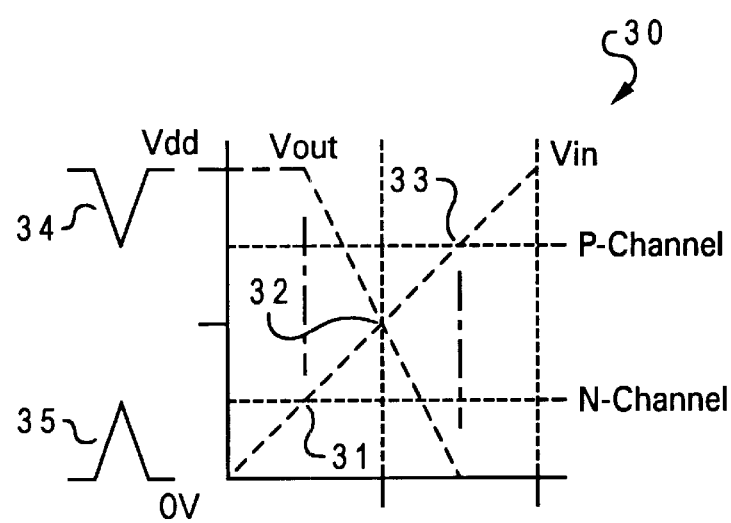
*Fig. 3*

SINGLE-EVENT UPSET TOLERANT LATCH FOR SENSE AMPLIFIERS

RELATED PATENT APPLICATION

The present patent application claims priority is related to copending application U.S. Ser. No. 60/224,648, filed on Aug. 11, 2000.

BACKGROUND OF THE INVENTION

1. Technical Field

The present invention relates to integrated circuits in general, and in particular to bi-stable integrated circuits. Still more particularly, the present invention relates to a single-event upset tolerant latch for sense amplifiers.

2. Description of the Prior Art

In certain environments, such as satellite orbital space, in which the level of radiation is relatively intense, electronic devices that utilize static random access memories (SRAMs) are more susceptible to single-event upsets (SEUs) or soft errors than they would have in terrestrial environments. These SEUs are typically caused by electron-hole pairs created by, and travelling along the path of, a single energetic particle as it passes through the memory cells of the SRAMs. Should the energetic particle generate a critical charge within a storage node of an SRAM cell, the logic state of the SRAM cell will be upset. Thus, the critical charge is the minimum amount of electrical charge required to change the logic state of the SRAM cell. By the same token, other circuits used in conjunction with SRAMs are also susceptible to SEUs. For example, one of such circuits are sense latches within sense amplifiers for SRAMs.

Referring now to the drawings and in particular to FIG. 1, there is illustrated a schematic diagram of a conventional sense latch that is commonly used in SRAMs. As shown, a sense latch 10 is constructed with two cross-coupled complementary metal oxide semiconductor (CMOS) inverters. The first inverter includes a p-channel transistor 11 connected in series with an n-channel transistor 12. The second inverter includes a p-channel transistor 13 connected in series with an n-channel transistor 14. The gates of transistors 11 and 12 are connected to the drains of transistors 13 and 14, and the gates of transistors 13 and 14 are connected to the drains of transistors 11 and 12. This arrangement of inverters is commonly referred to as cross-coupled inverters, and the two lines connecting the gates and the drains of the inverters are commonly referred to as cross-coupling lines. The drains of transistors 11, 12 and the gates of transistors 13, 14 are connected to a bitline BL. Similarly, the drains of transistors 13, 14 and the gates of transistors 11, 12 are connected to a bitline $\overline{BL}$. Both BL and $\overline{BL}$ are connected to a column of SRAM cells for sensing a logical state of a specific SRAM cell, as it is well-known to those skilled in the art. The cross-coupled inverters are coupled to ground via an n-channel transistor 15 that can be controlled by a SET signal to the gate of transistor 15.

During operation, BL and $\overline{BL}$ are equally charged to the positive power supply potential with the SET signal at the gate of transistor 15 held to ground potential. When an SRAM cell in the column above sense latch 10 is accessed, the SRAM cell begins to discharge either BL or $\overline{BL}$ by a few hundred millivolts. At which time, the SET signal at the gate of transistor 15 is raised to the positive supply potential, causing conduction in the cross-coupled inverters to begin. The slight imbalance in potential on BL and $\overline{BL}$ is amplified by the non-linear conduction behavior of the p-channel transistors at conduction threshold, causing a regenerative amplification to occur that causes either BL or $\overline{BL}$ to be discharged all the way to ground potential in order to reflect the same logical as that of the SRAM cell. At this point, the SRAM cell may be disconnected from BL and $\overline{BL}$ without changing the logical state of sense latch 10. If, however, an energetic atomic particle intersects any of the diffusion regions of BL or $\overline{BL}$ that has remained in the positive logical state, the energetic atomic particle can transiently drives that node below the unity gain point of the inverters within sense latch 10, causing an indeterminate state after recovery from the transient. Such state may be of opposite polarity from the pre-transient state, signifying an SEU event has occurred.

Consequently, it would be desirable to provide an SEU tolerant sense latch.

SUMMARY OF THE INVENTION

In accordance with a preferred embodiment of the present invention, a single-event upset tolerant sense latch circuit includes a first set of isolation transistors, a second set of isolation transistors, a first set of dual-path inverters, a second set of dual-path inverters, and an isolation transistor. The first set of isolation transistors is coupled to a first bitline, and the second set of isolation transistors is coupled to a second bitline. The second bitline is complementary to the first bitline. The first set of dual-path inverters is coupled to the first set of isolation transistors, and the first set of dual-path inverters includes a first transistor connected to a second transistor in series along with a third transistor connected to a fourth transistor in series. The second set of dual-path inverters is coupled to the second set of isolation transistors, and the second set of dual-path inverters includes a fifth transistor connected to a sixth transistor in series along with a seventh transistor connected to an eighth transistor in series. The isolation transistor couples the first and second sets of dual-path inverters to ground.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIG. 1 is a schematic diagram of a conventional sense latch;

FIG. 2 is a schematic diagram of a conventional inverter;

FIG. 3 is a graphical illustration of the input-output characteristics of the inverter from FIG. 2;

DETAILED DESCRIPTION OF A PREFERRED EMBODIMENT

Figure 4C:
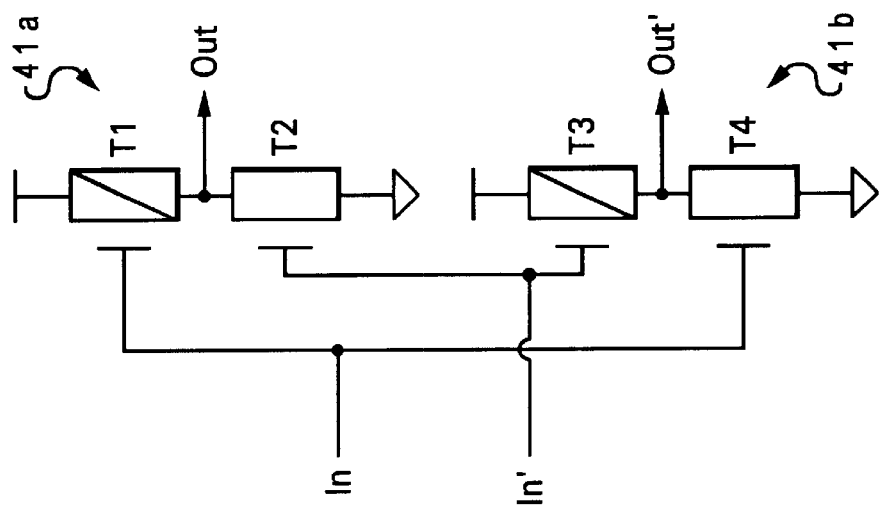
FIGS. 4a–4c are schematic diagrams of various configurations of two inverters connected in parallel.

With reference now to FIG. 2, there is illustrated a schematic diagram of an inverter. As shown, an inverter 20 includes a p-channel transistor 21 connected in series with an n-channel transistor 22. The source of p-channel transistor 21 is connected to a power supply, and the source of n-channel transistor 22 is connected to ground. P-channel transistor 21 conducts when its gate potential is more negative than its threshold voltage, and n-channel transistor 22 conducts when its gate potential is more positive than its threshold voltage.

The input-output characteristics of inverter 20 can be graphically illustrated, as shown in FIG. 3. The Y-axis of a graph 30 plots input signal amplitudes, and the X-axis of graph 30 plots time. An input voltage $V_{in}$ to inverter 20 is plotted as a linear ramp. As input voltage $V_{in}$ crosses a threshold voltage 31 of n-channel transistor 22, an output voltage $V_{out}$ from inverter 20 begins to decrease, eventually equaling input voltage $V_{in}$ at an unity gain point 32. As input voltage $V_{in}$ continues to increase, output voltage $V_{out}$ continues to decrease until input voltage $V_{in}$ arrives at a threshold voltage 33 of p-channel transistor 21, at which point p-channel transistor 21 stops conducting for all effective purposes. The voltage at unity gain point 32 is established by the relative current gains of both p-channel transistor 21 and n-channel transistor 22. For equal positive and negative transition times, unity gain point 32 is at half of the supply voltage value ($V_{dd}$) to inverter 20. From a radiation hardening viewpoint, unity gain point 32 is also the optimum point because the noise transients will not be stretched in width, and there is equal balance for noise pulses on the power and ground distributions.

Thus, if input noise pulses to inverter 20 are below the absolute value of the threshold voltages of the two transistors within inverter 20, noise pulses do not propagate through inverter 20, as shown by triangular pulses 34 and 35 to the left of graph 30. This allows reliable operation in a very noisy environment.

Figure 4B:
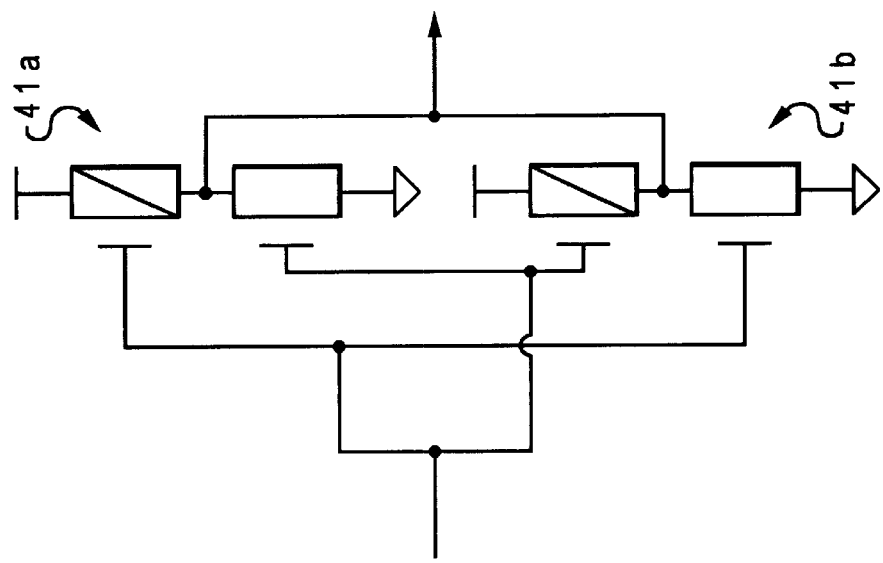
Figure 4A:
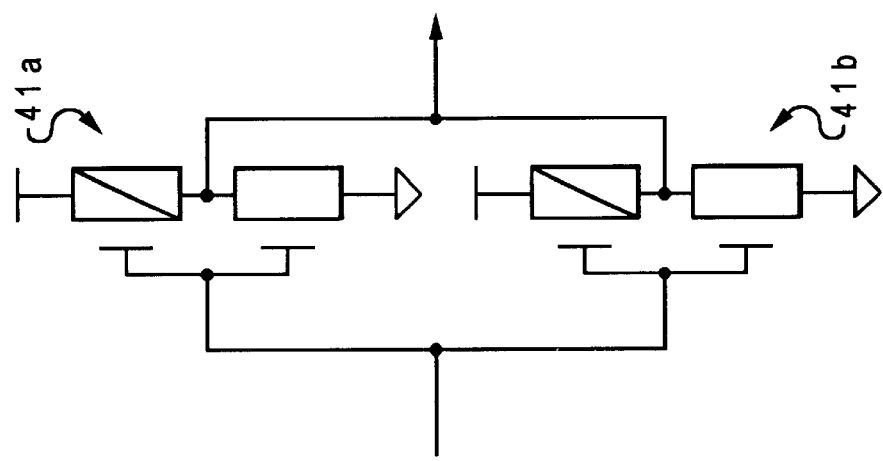

The drive capability of inverter 20 can be increased by increasing the width of both p-channel transistor 21 and n-channel transistor 22, which can be accomplished by putting two inverters in parallel, as shown in FIG. 4a. Since the input signal is the same for inverters 41a and 41b, the connections between inverters 41a and 41b can be changed without affecting any circuit operation, as depicted in FIG. 4b. The inputs of inverters 41a, 41b can also be driven by two distinctly separate nets, as shown in FIG. 4c. As long as signals In and In' are of the same polarity and are timed to coincide, outputs Out and Out' remain identical. If, however, In and In' have different polarities, then the simplistic treatment of noise rejection would not be applicable.

Figure 5A:
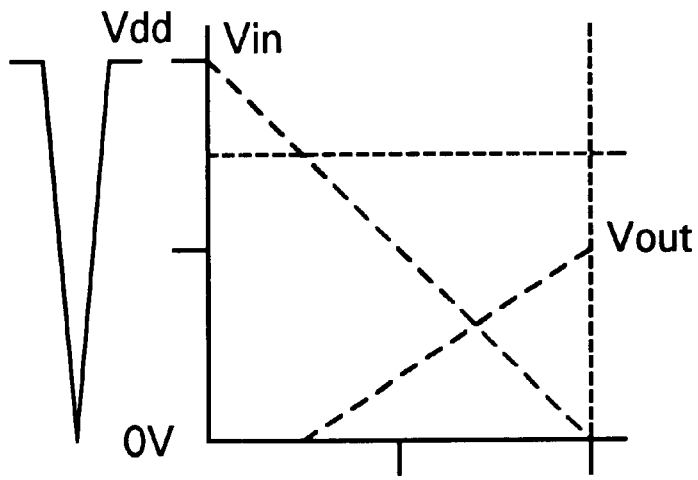
FIGS. 5a–5b are graphical illustrations of the input-output characteristics of the inverter from FIG. 4c.

In FIG. 4c, assume a large negative going transient occurred at input In when both inputs In and In' are at $V_{dd}$ potential, with p-channel transistors T1, T3 fully turned off and n-channel transistors T2, T4 fully turned on. Then, p-channel transistor T1 is turned on, but since n-channel transistor T2 is also turned on, and the current gains of both polarities of transistor T2 and T3 are balanced as described previously, output Out can only rise to half $V_{dd}$ potential because p-channel transistor T3 and n-channel transistor T2 are both turned on to form a voltage divider, while the negative transient only serves to turn off n-channel transistor T4 without turning on p-channel transistor T3, tristating inverter 41b such that nothing happens at output Out'. The transient is attenuated at one output, while not affecting the other, as shown in FIG. 5a. The output transient amplitude is insufficient to drive a subsequent stage to its unity gain point, causing the transient to be attenuated and subsided in subsequent stages.

Figure 5B:
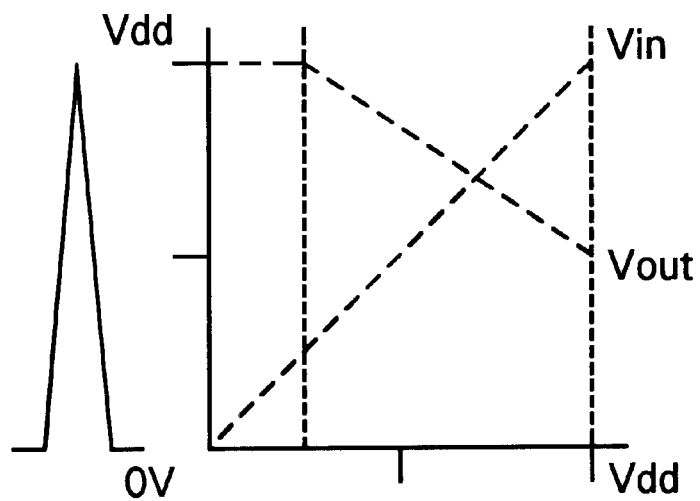

In contrast, assume a large positive going transition at input In when both inputs In and In' in FIG. 4c are low, with p-channel transistors T1, T3 fully turned on, and n-channel transistors T2, T4 fully turned off. Then, n-channel transistor T4 is turned on, but since p-channel transistor T3 is also turned on, so output Out' can only fall to half $V_{dd}$, again because of the voltage divider effect formed by transistors T2 and T3. Output Out is not affected because p-channel transistor T1 is turned off by the positive going transient at its gate and n-channel transistor T2 is also turned off, so output Out does not change state due to capacitive storage at output Out, as shown in FIG. 5b. Here, again, the half $V_{dd}$ output transient is insufficient in amplitude to drive a subsequent stage to its unity gain point, causing the transient to be attenuated and subsided in subsequent stages.

Figure 6:
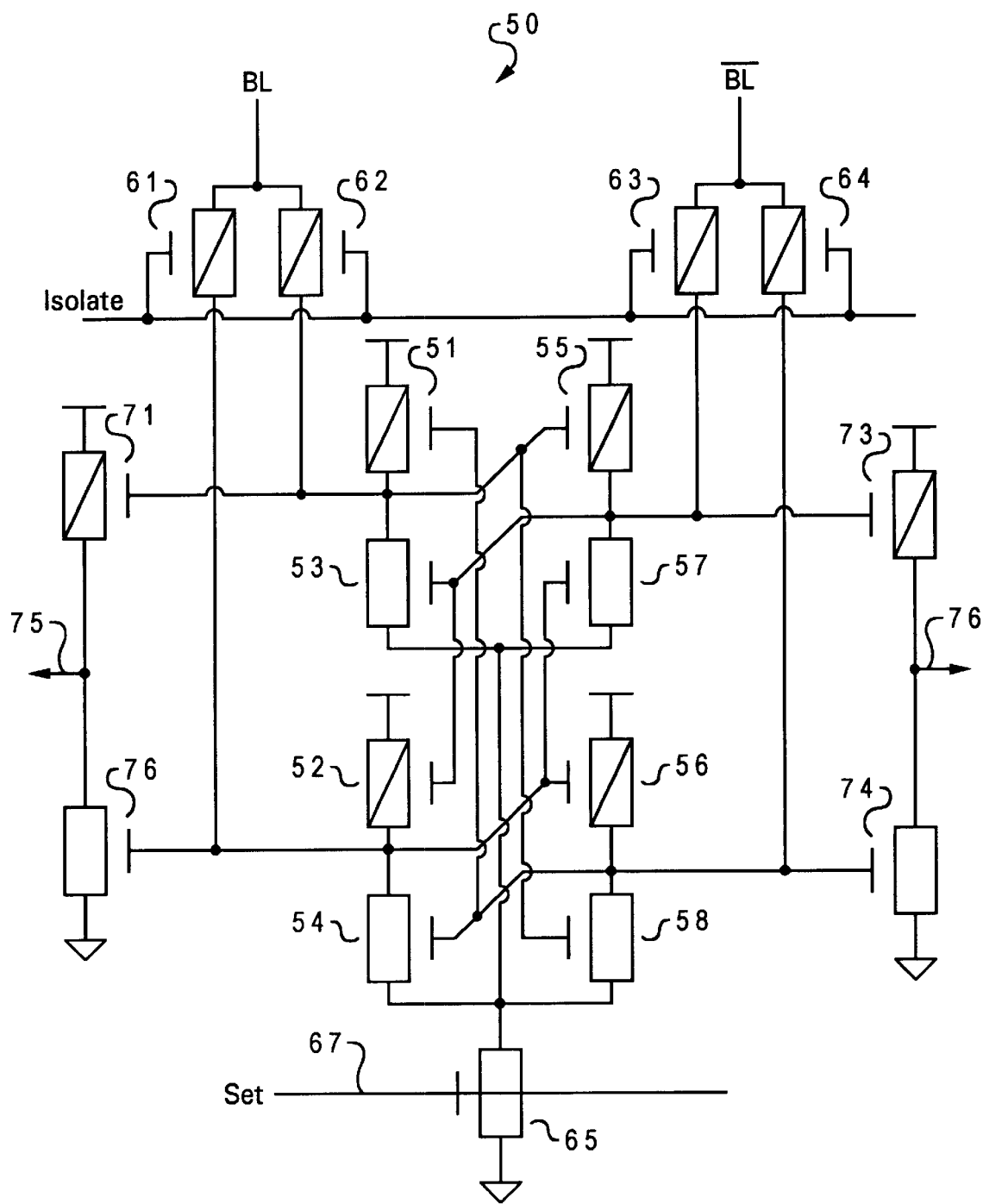
FIG. 6 is a schematic diagram of a single-event upset (SEU) immune sense latch, in accordance with a preferred embodiment of the present invention.

With reference now to FIG. 6, there is illustrated a schematic diagram of a single-event upset (SEU) immune sense latch, in accordance with a preferred embodiment of the present invention. As shown, an SEU immune sense latch 50 includes four p-channel isolation transistors 61–64, an n-channel set transistor 65, and two sets of dual-path inverters. The first set of dual-path inverters includes p-channel transistors 51–52 and n-channel transistors 53–54. The second set of dual-path inverters includes p-channel transistors 55–56 and n-channel transistors 57–58. Transistor 51 is connected in series with transistor 53, and transistor 52 is connected in series with transistor 54. The gate of transistor 51 is connected to the gate of transistor 54 and the node between transistors 56, 58. The gate of transistor 52 is connected to the gate of transistor 53 and the node between transistors 55, 57. Transistor 55 is connected in series with transistor 57, and transistor 56 is connected in series with transistor 58. The gate of transistor 55 is connected to the gate of transistor 58 and the node between transistors 51, 53. The gate of transistor 56 is connected to the gate of transistor 57 and the node between transistors 52, 54. Set transistor 65 couples the first set and the second set of dual-path inverters to ground. Specifically, set transistor 65 couples transistors 53–54 and transistors 57–58 to ground.

In addition, the output of the first set of dual-path inverter is coupled to a first output buffer that includes a p-channel transistor 71 connected in series with an n-channel transistor 72. Specifically, the gate of transistor 71 is connected to the drain of isolation transistor 62 and the node between transistors 51, 53; also, the gate of transistor 72 is connected to the drain of isolation transistor 61 and the node between transistors 52, 54. Similarly, the output of the second set of dual-path inverter is coupled to a second output buffer that includes a p-channel transistor 73 connected in series with an n-channel transistor 74. Specifically, the gate of transistor 73 is connected to the drain of isolation transistor 63 and the node between transistors 55, 57; also, the gate of transistor 74 is connected to the drain of isolation transistor 64 and the node between transistors 56, 58. The first output buffer provides an output 75 and the second output buffer provides an output 76. The first output buffer is opposite in output phase to that of the second output buffer. Because each of the first and second output buffers has a dual-gate connection to the corresponding dual-path inverter, both gates of the output buffer need to be triggered by signals of identical polarity in order for the signals to propagate to the output of the output buffer. As such, both output buffers are also SEU tolerant.

During operation, an isolate input 66 is initially at a logical low potential (i.e., ground), rendering isolation transistors 61–64 fully conductive. In addition, an set input 67 is also at a logical low potential, preventing conduction to occur in set transistor 65. When bitlines BL and $\overline{BL}$ are being precharged to a logical high potential, the potential is also impressed on the associated nodes of the two cross-coupled dual-path inverters. When an SRAM cell associated with bitlines BL and $\overline{BL}$ is being accessed, either BL or $\overline{BL}$ begins to decrease in voltage amplitude as charge is being removed by the corresponding bitline of the accessed SRAM cell. When the voltage imbalance is of sufficient amplitude to be reliably latched, set input 67 is raised to a logical high potential (i.e., power supply voltage), causing set transistor 65 to conduct. The cross-coupled dual-path inverters have different conduction amplitudes caused by the voltage imbalance and, again, regenerative action causes the cross-coupled latch to assume the state of the accessed SRAM cell. At this point, isolate input 66 can be raised to the logical high potential, rendering isolation transistors 61–64 non-conductive, which effectively separates the input nodes of the cross-coupled dual-path inverters from each other. The accessed SRAM cell may now be disassociated from sense latch 50.

An alternative valid timing is to raise the potential of isolate input 66 to the point when the nodes connected to BL or $\overline{BL}$ have established the signal imbalance caused by the accessed SRAM cell. As such, the cross-coupled dual-path inverters are isolated from BL and $\overline{BL}$ before the potential of set input 67 is raised. This disconnects the large parasitic capacitance associated with BL and $\overline{BL}$ from the capacitance of the internal nodes within sense latch 50. With less parasitic capacitance, sense latch 50 has a faster setting time because there are less charges to discharge. Once isolate input 66 is raised and sense latch 50 is set, the state of sense latch 50 cannot be disturbed by any single event transient because of the attenuation characteristics of the two dual-path inverters as described before. The latched signal within sense latch 50 can be utilized as it is well-known in the art.

An alternative configuration would be used in the situation where it is desirable to precharge BL and $\overline{BL}$ to a low voltage potential—an n-channel transistor threshold above ground. In this case, isolation transistors 61–64 would be n-channel transistors instead of p-channel transistors (the polarity of isolate input 66 would be reversed from what was described above). Initially, the accessed SRAM cell raises the potential of one of the bitlines and discharge the other. When sufficient differential amplitude is attained on BL and $\overline{BL}$, set input 67 is the raised to a logical high potential as described previously.

As has been described, the present invention provides an SEU tolerant sense latch. Any internal node of the SEU tolerant sense latch can be tied either to ground or $V_{dd}$ without changing the state of the SEU immune sense latch permanently. If one wants to change the internal state of the SEU tolerant sense latch, one must drive both inputs of either of the dual-path inverters at the same time with the same signal potential. The probability that two charged particles intersect the SEU tolerant sense latch at the same time with one to each of the critical nodes to cause an SEU to occur is about four orders of magnitude less than the probability of a single hit.

Figure 7:
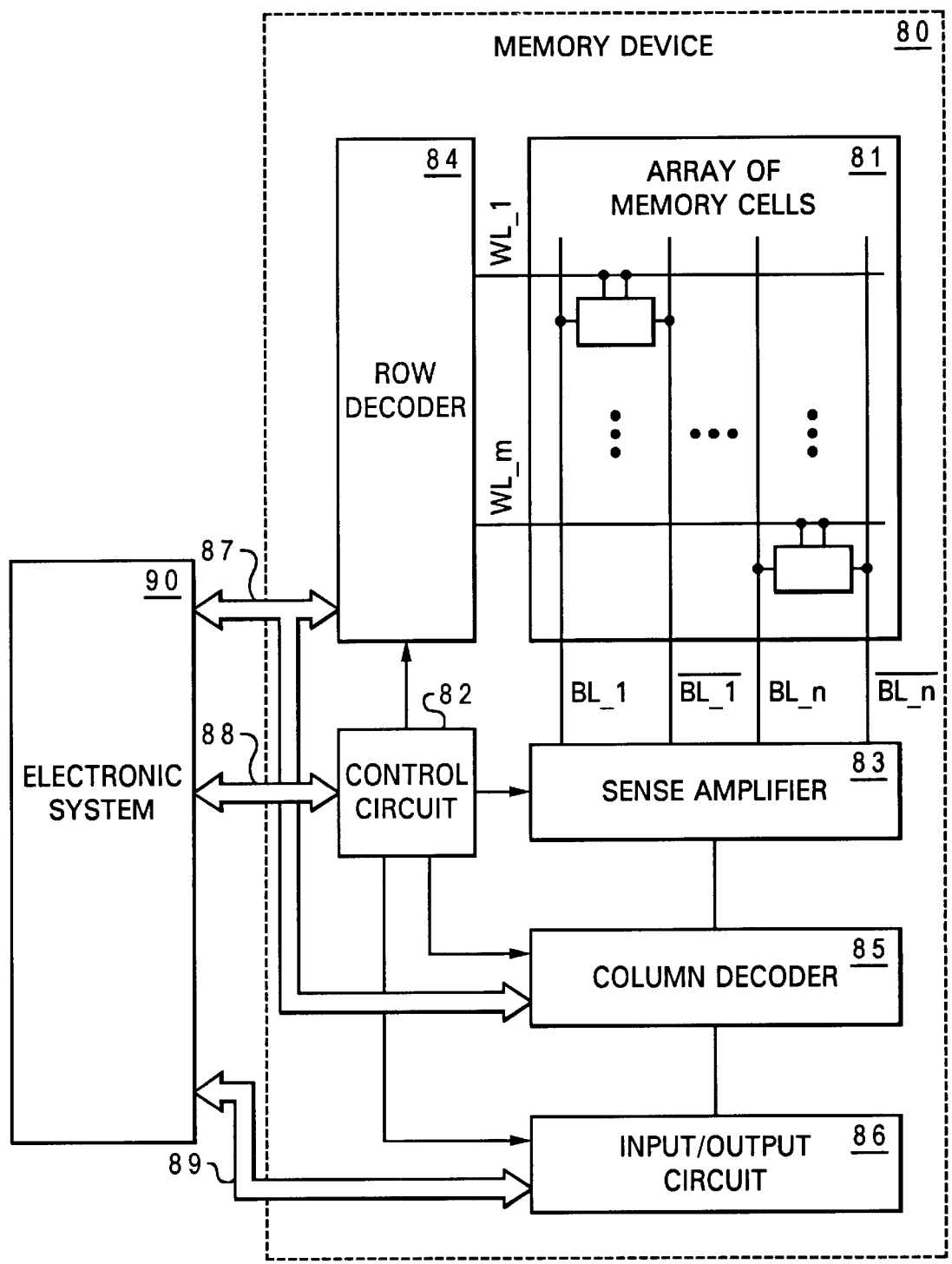
FIG. 7 is a block diagram of an electronic system having a memory device along with an SEU immune sense latch, in accordance with a preferred embodiment of the present invention.

The SEU tolerant sense latch of the present invention may be utilized within a variety of apparatuses having SRAMs along with a sense amplifier for the SRAMs. For example, referring now to FIG. 7, there is depicted a block diagram of an apparatus in which a preferred embodiment of the present invention may be incorporated. As shown, the apparatus includes an electronic system 90 coupled to a memory device 80. Electronic system 90 may be, for example, a processor, a memory controller, a chip set or any system that stores data in a memory device such as memory device 80. Electronic system 90 is coupled to a row decoder 84 and a column decoder 85 of memory device 80 via address lines 87. Electronic system 90 is also coupled to a control circuit 82 of memory device 80 via control lines 88. In addition, electronic system 90 is coupled to an input/output circuit 86 of memory device 80 via input/output lines 89.

Memory device 80 includes a sense amplifier 83 and a memory cell array 81. Memory cell array 81 includes a number of wordlines (i.e., WL_1 through WL_m) and a number of bit line pairs (i.e., BL_1 through BL_n and $\overline{BL}$_1 through $\overline{BL}$_n). Along with sense amplifier 83, memory cell array 81 is constructed to use a memory cell sensing scheme such that each bitline pair is to be used in reading and writing data into a SRAM cell such as memory cell array 81.

While the invention has been particularly shown and described with reference to a preferred embodiment, it will be understood by those skilled in the art that various changes in form and detail may be made therein without departing from the spirit and scope of the invention.

What is claimed is:

1. A single-event upset tolerant sense latch circuit, comprising:
   a first set of dual-path inverters includes a first transistor connected to a second transistor in series and a third transistor connected to a fourth transistor in series; and
   a second set of dual-path inverters includes a fifth transistor connected to a sixth transistor in series and a seventh transistor connected to an eighth transistor in series, wherein the gates of said first and fourth transistors are connected to a node between said seventh and eighth transistors, the gates of said second and third transistors are connected to a node between said fifth and sixth transistors, the gates of said fifth and eighth transistors are connected to a node between said first and second transistors, and the gates of said sixth and seventh transistors are connected to a node between said third and fourth transistors.

2. The single-event upset tolerant sense latch circuit of claim 1, wherein said first, third, fifth and seventh transistors are p-channel transistors, and said second, fourth, sixth and eighth transistors are n-channel transistors.

3. The single-event upset tolerant sense latch circuit of claim 1, wherein the output of said first set of dual-path inverter is connected to a first output buffer, and the output of said second set of dual-path inverter is connected to a second output buffer.

4. The single-event upset tolerant sense latch circuit of claim 1, wherein said circuit further includes
   a first set of isolation transistors coupled to a first bitline, wherein said first set of isolation transistors is coupled to said first set of dual-path inverters; and
   a second set of isolation transistors coupled to a second bitline, wherein said second bitline is complementary to said first bitline, wherein said second set of isolation transistors is coupled to said second set of dual-path inverters.

5. The single-event upset tolerant sense latch circuit of claim 4, wherein said first set of isolation transistors is coupled to said node between said first and second transistors and said node between said third and fourth transistors, and said second set of isolation transistors is coupled to said node between said fifth and sixth transistors and said node between said seventh and eighth transistors.

6. The single-event upset tolerant sense latch circuit of claim 4, wherein said first and second sets of isolation transistors are p-channel transistors.

7. The single-event upset tolerant sense latch circuit of claim 1, wherein said circuit further includes an isolation transistor for coupling said first and second sets of dual-path inverters to ground.

8. The single-event upset tolerant sense latch circuit of claim 7, wherein said isolation transistor is an n-channel transistor.

9. A memory device, comprising:
- a sense amplifier having a single-event upset tolerant sense latch, wherein said single-event upset tolerant sense latch includes:
  - a first set of dual-path inverters includes a first transistor connected to a second transistor in series and a third transistor connected to a fourth transistor in series; and
  - a second set of dual-path inverters includes a fifth transistor connected to a sixth transistor in series and a seventh transistor connected to an eighth transistor in series, wherein the gates of said first and fourth transistors are connected to a node between said seventh and eighth transistors, the gates of said second and third transistors are connected to a node between said fifth and sixth transistors, the gates of said fifth and eighth transistors are connected to a node between said first and second transistors, and the gates of said sixth and seventh transistors are connected to a node between said third and fourth transistors;
- an addressing circuitry having a row decoder and a column decoder;
- an array of wordlines and complementary bitline pairs, coupled to said sense amplifier and said addressing circuitry; and
- a plurality of memory cells located at an intersection of each of said wordlines and said bitline pairs.

10. The memory device of claim 7, wherein said first, third, fifth and seventh transistors are p-channel transistors, and said second, fourth, sixth and eighth transistors are n-channel transistors.

11. The memory device of claim 9 wherein the output of said first set of dual-path inverter is connected to a first output buffer, and the output of said second set of dual-path inverter is connected to a second output buffer.

12. The memory device of claim 9, wherein said memory device further includes
- a first set of isolation transistors coupled to a first bitline, wherein said first set of isolation transistors is coupled to said first set of dual-path inverters; and
- a second set of isolation transistors coupled to a second bitline, wherein said second bitline is complementary to said first bitline, wherein said second set of isolation transistors is coupled to said second set of dual-path inverters.

13. The memory device of claim 12, wherein said first set of isolation transistors is coupled to said node between said first and second transistors and said node between said third and fourth transistors, and said second set of isolation transistors is coupled to said node between said fifth and sixth transistors and said node between said seventh and eighth transistors.

14. The memory device of claim 12, wherein said first and second sets of isolation transistors are p-channel transistors.

15. The memory device of claim 9, wherein said memory device further includes an isolation transistor for coupling said first and second sets of dual-path inverters to ground.

16. The memory device of claim 15, wherein said isolation transistor is an n-channel transistor.

17. An apparatus, comprising:
- an electronic system; and
- a memory device coupled to said electronic system, wherein said memory device includes a plurality of memory cells and a sense amplifier, wherein said sense amplifier includes a single-event upset tolerant sense latch, wherein said single-event upset tolerant sense latch includes:
  - a first set of dual-path inverters includes a first transistor connected to a second transistor in series and a third transistor connected to a fourth transistor in series; and
  - a second set of dual-path inverters includes a fifth transistor connected to a sixth transistor in series and a seventh transistor connected to an eighth transistor in series, wherein the gates of said first and fourth transistors are connected to a node between said seventh and eighth transistors, the gates of said second and third transistors are connected to a node between said fifth and sixth transistors, the gates of said fifth and eighth transistors are connected to a node between said first and second transistors, and the gates of said sixth and seventh transistors are connected to a node between said third and fourth transistors.

18. The apparatus of claim 17, wherein said first, third, fifth and seventh transistors are p-channel transistors, and said second, fourth, sixth and eighth transistors are n-channel transistors.

19. The apparatus of claim 17, wherein the output of said first set of dual-path inverter is connected to a first output buffer, and the output of said second set of dual-path inverter is connected to a second output buffer.

20. The apparatus of claim 17, wherein said electronic system is a processor.

21. The apparatus of claim 17, wherein said electronic system is a memory controller.

22. The apparatus of claim 17, wherein said apparatus further includes
- a first set of isolation transistors coupled to a first bitline, wherein said first set of isolation transistors is coupled to said first set of dual-path inverters; and
- a second set of isolation transistors coupled to a second bitline, wherein said second bitline is complementary to said first bitline, wherein said second set of isolation transistors is coupled to said second set of dual-path inverters.

23. The apparatus of claim 22, wherein said first set of isolation transistors is coupled to said node between said first and second transistors and said node between said third and fourth transistors, and said second set of isolation transistors is coupled to said node between said fifth and sixth transistors and said node between said seventh and eighth transistors.

24. The apparatus of claim 23, wherein said first and second sets of isolation transistors are p-channel transistors.

25. The apparatus of claim 17, wherein said apparatus further includes an isolation transistor for coupling said first and second sets of dual-path inverters to ground.

26. The apparatus of claim 25, wherein said isolation transistor is an n-channel transistor.

* * * * *